(12) United States Patent
Hebard et al.

(10) Patent No.: US 9,362,365 B2
(45) Date of Patent: Jun. 7, 2016

(54) GRAPHITE AND/OR GRAPHENE SEMICONDUCTOR DEVICES

(71) Applicant: University of Florida Research Foundation, Inc., Gainesville, FL (US)

(72) Inventors: Arthur Foster Hebard, Gainesville, FL (US); Sefaattin Tongay, Mesa, AZ (US)

(73) Assignee: UNIVERSITY OF FLORIDA RESEARCH FOUNDATION, INC., Gainesville, FL (US)

( * ) Notice: Subject to any disclaimer, the term of this patent is extended or adjusted under 35 U.S.C. 154(b) by 0 days.

(21) Appl. No.: 14/524,465

(22) Filed: Oct. 27, 2014

(65) Prior Publication Data

US 2015/0053926 A1 Feb. 26, 2015

Related U.S. Application Data

(62) Division of application No. 13/577,964, filed as application No. PCT/US2011/028319 on Mar. 14, 2011, now Pat. No. 8,890,277.

(60) Provisional application No. 61/314,127, filed on Mar. 15, 2010.

(51) Int. Cl.
| | |
|---|---|
| *H01L 29/16* | (2006.01) |
| *H01L 29/47* | (2006.01) |
| *H01L 29/778* | (2006.01) |
| *H01L 29/812* | (2006.01) |
| *H01L 29/872* | (2006.01) |
| *H01L 29/78* | (2006.01) |
| *H01L 29/20* | (2006.01) |

(52) U.S. Cl.
CPC ............ *H01L 29/1606* (2013.01); *H01L 29/47* (2013.01); *H01L 29/475* (2013.01); *H01L 29/7786* (2013.01); *H01L 29/78* (2013.01); *H01L 29/812* (2013.01); *H01L 29/872* (2013.01); *H01L 29/1608* (2013.01); *H01L 29/2003* (2013.01)

(58) Field of Classification Search
CPC .............. H01L 29/1606; H01L 29/812; H01L 29/8122; H01L 29/8126; H01L 29/8128; H01L 29/7786; H01L 29/7787; H01L 29/47; H01L 29/475; H01L 29/1608; H01L 29/2003
See application file for complete search history.

(56) References Cited

U.S. PATENT DOCUMENTS

| | | | | |
|---|---|---|---|---|
| 8,278,643 B2 * | 10/2012 | Bowers et al. | ..................... | 257/9 |
| 8,535,553 B2 * | 9/2013 | Kong et al. | ..................... | 216/95 |
| 2007/0187694 A1 * | 8/2007 | Pfeiffer | ........................... | 257/76 |

(Continued)

*Primary Examiner* — Anthony Ho
*Assistant Examiner* — Samuel Lair
(74) *Attorney, Agent, or Firm* — Thomas|Horstemeyer, LLP.

(57) ABSTRACT

Various embodiments are provided for graphite and/or graphene based semiconductor devices. In one embodiment, a semiconductor device includes a semiconductor layer and a semimetal stack. In another embodiment, the semiconductor device includes a semiconductor layer and a zero gap semiconductor layer. The semimetal stack/zero gap semiconductor layer is formed on the semiconductor layer, which forms a Schottky barrier. In another embodiment, a semiconductor device includes first and second semiconductor layers and a semimetal stack. In another embodiment, a semiconductor device includes first and second semiconductor layers and a zero gap semiconductor layer. The first semiconductor layer includes a first semiconducting material and the second semiconductor layer includes a second semiconducting material formed on the first semiconductor layer. The semimetal stack/zero gap semiconductor layer is formed on the second semiconductor layer, which forms a Schottky barrier.

20 Claims, 13 Drawing Sheets

(56) References Cited

U.S. PATENT DOCUMENTS

| | | | |
|---|---|---|---|
| 2008/0272397 A1* | 11/2008 | Koudymov et al. | 257/192 |
| 2009/0020764 A1* | 1/2009 | Anderson et al. | 257/77 |
| 2009/0032804 A1* | 2/2009 | Kalburge | 257/24 |
| 2009/0169919 A1* | 7/2009 | Garcia et al. | 428/688 |
| 2010/0006823 A1* | 1/2010 | Anderson et al. | 257/24 |
| 2011/0089404 A1* | 4/2011 | Marcus et al. | 257/29 |
| 2011/0114918 A1* | 5/2011 | Lin | H01L 29/1606 257/24 |
| 2011/0217544 A1* | 9/2011 | Young et al. | 428/327 |

\* cited by examiner

GRAPHITE AND/OR GRAPHENE SEMICONDUCTOR DEVICES

CROSS REFERENCE TO RELATED APPLICATIONS

This application is a divisional of U.S. utility application Ser. No. 13/577,964, filed Aug. 9, 2012 which is the 35 U.S.C. §371 national stage of PCT application PCT/US2011/28319, filed Mar. 14, 2011, which claims priority to and the benefit of U.S. provisional application entitled "GRAPHITE AND/OR GRAPHENE SEMICONDUCTOR DEVICES" having Ser. No. 61/314,127, filed Mar. 15, 2010, both of which are hereby incorporated by reference in their entirety.

STATEMENT REGARDING FEDERALLY SPONSORED RESEARCH OR DEVELOPMENT

This invention was made with government support under agreements DMR-0704240 and DMR-0851707 awarded by the National Science Foundation. The Government has certain rights in the invention.

BACKGROUND

Silicon based devices are ubiquitous components of consumer and defense related electronics. For example, silicon based devices are used in electronic applications and solar cells, gallium arsenide (GaAs) based devices include light emitting diodes (LEDs), low-noise amplifiers, and high electron mobility transistors (HEMTs). Gallium nitride (GaN) based devices and silicon carbide (SiC) based devices include HEMTs, metal semiconductor field effect transistors (MESFETs), The Schottky barrier is an important feature of these solar cell, HEMT and MESFET devices.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1A:
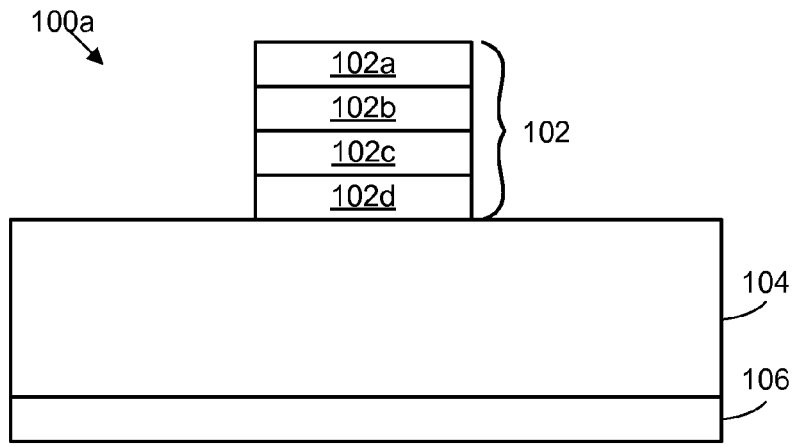
FIGS. 1A and 1B are graphical representations of examples of a Schottky diode including a semimetal stack in accordance with various embodiments of the present disclosure.

Disclosed herein are various embodiments related to graphite and/or graphene semiconductor devices. Reference will now be made in detail to the description of the embodiments as illustrated in the drawings, wherein like reference numbers indicate like parts throughout the several views.

Examples of these embodiments of graphite and/or graphene semiconductor devices include a Schottky diode (e.g., a semimetal-semiconductor device or a zero-gap semiconductor (ZGS)-semiconductor device) including graphite and/or graphene, as well as a semimetal-semiconductor field effect transistor (SMESFET) including graphite and/or graphene, a ZGS-semiconductor field effect transistor (ZGS-FET), a high electron mobility transistor (HEMT) including graphite and/or graphene, and/or a metal semiconductor field effect transistor (MESFET) including graphite and/or graphene. A Schottky diode has a rectifying characteristic such that when the Schottky diode is forward biased, large currents flow, whereas when the Schottky diode is reversed biased, significantly smaller currents flow. SMESFETs, ZGS-FETs, and HEMTs behave like switches that control a flow of current between source and drain contacts based on a voltage applied to one of the electrodes of the SMESFET, ZGSFET, and/or HEMT.

Graphite, a semimetal, is an allotrope of carbon, and a single atomic layer of graphite is called graphene. Accordingly, graphite includes graphene layers. Isolated graphene sheets are zero gap semiconductors in which the conduction and valence bands just touch, in contrast to semiconductors where there is an energy gap between the conduction and valence bands and semimetals where the conduction and valence bands can overlap. Graphite conducts electricity in a planar direction, $\rho_{ab}$, but the conductivity is up to four orders of magnitude less in a direction orthogonal to the atomic layer, $\rho_c$. In some embodiments, the graphite includes foreign impurity atoms intercalated between its graphene layers. The foreign impurity atoms attract electrons and/or holes from the neighboring graphene layers in the graphite, and thus "dope" the graphite with mobile carriers, majority electrons or holes. The doping of the graphite enables tuning of the Schottky barrier height formed at the graphite-graphene to semiconductor junction by changing the work function of the graphite. Similarly, graphene can be p-doped by spin coating Gold (III) Chloride (AuCl3) or Bis(trifluoromethanesulfonyl) amine and n-doped by inducing Nitrogen atoms to the graphene surface. The Schottky diodes, SMESFETs, ZGS-FETs, MESFETs and HEMTs described herein have high Schottky barrier heights when doped, resulting in improved performance of each device. Additionally, the Schottky barrier height may be decreased by electron doping instead of being increased by hole doping.

Figure 1B:
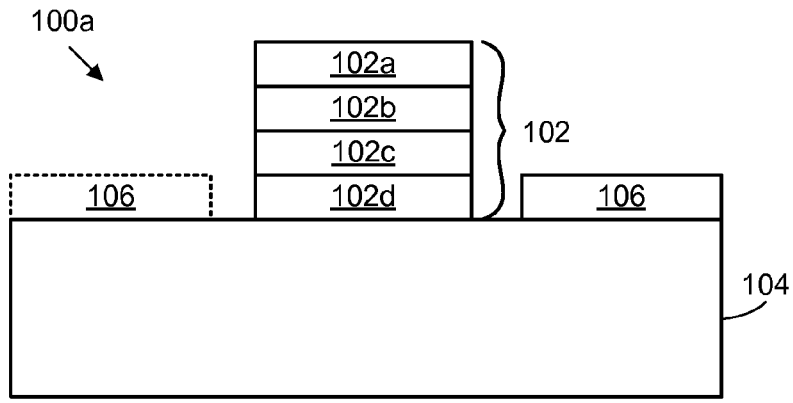

FIGS. 1A and 1B are cross-sectional views of an example of an embodiment of a Schottky diode 100, denoted in FIGS. 1A and 1B as 100a. The Schottky diode 100a includes a semimetal stack 102 formed on a semiconductor layer 104. The junction between a layer of graphite or graphene (a zero gap semiconductor) of the semimetal stack 102 and the semiconductor layer 104 creates a Schottky barrier. In some embodiments, such as the ones illustrated in FIGS. 1A and 1B, the semiconductor 104 layer is contacted by an ohmic contact layer 106. The ohmic contact layer 106 may be on the side opposite the semimetal stack 102 as illustrated in FIG. 1A or may be on the same side as, but separated from, the semimetal stack 102 as illustrated in FIG. 1B. For example, the ohmic contact layer 106 may partially encircle the semimetal stack 102 or ZGS layer 102d. The semiconductor layer 104 may include one or more of a variety of semiconducting materials such as Si, GaAs, SiC (e.g., 4H—SiC), GaN, and/or another semiconducting material.

The highest temperatures at which the Schottky diode 100a can operate depends on the semiconducting material included in the semiconductor layer 104 and its interaction with the semimetal stack 102. For example, a Schottky diode 100a having a semiconductor layer 104 including Si can operate to temperatures as high as about 400 K to about 500 K. For a semiconductor layer 104 including GaAs, the highest temperature ranges from about 500 K to about 600 K. For a semiconductor layer 104 including SiC, the highest temperature ranges from about 900 K to about 1100 K. For a semiconductor layer 104 including GaN, the highest temperature ranges from about 600 K to about 1200 K.

In some embodiments, such as the ones illustrated in FIGS. 1A and 1B, the semimetal stack 102 includes multiple layers such as a graphite layer 102a, one or more "few-layer" graphene layers 102b, 102c, and a graphene layer 102d. In other embodiments, layer 102d is a semimetal layer of graphite. As mentioned above, graphite is a semimetal and is an allotrope of carbon. A single atomic layer of graphite is called graphene and is a zero gap semiconductor. Graphite and graphene are each able to conduct electricity due to the delocalization of the pi bond electrons above and below the planes of the carbon atoms. These electrons are free to move, enabling the graphite to conduct electricity. In graphite, each carbon atom uses only three of its four outer energy level electrons in covalently bonding to three other carbon atoms in a plane. Each carbon atom contributes one electron to a delocalized system of electrons that is also part of the chemical bonding. The delocalized electrons are free to move throughout the plane. For this reason, graphite (and graphene) conducts electricity along the planes of carbon atoms, but does not conduct as well in a direction orthogonal to those planes.

Figure 2:
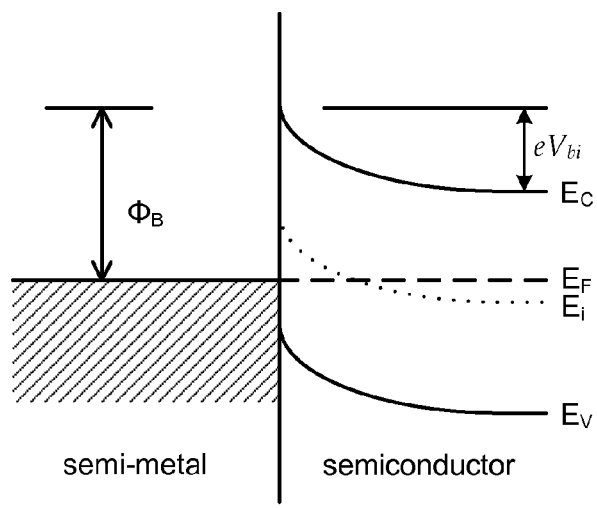
FIG. 2 illustrates an example of an energy diagram of a Schottky barrier in accordance with various embodiments of the present disclosure.

The junction of the semimetal/zero gap semiconductor layer 102d of the semimetal stack 102 and the semiconductor layer 104 in the Schottky diode 100a forms a Schottky barrier. FIG. 2 illustrates an example of an energy diagram of a Schottky barrier. The Schottky barrier height $\phi_B$ is the difference between the energy level of the conduction band $E_C$ and the Fermi level $E_F$ of the semimetal. Methods of measuring and calculating Schottky barrier heights as well as experimental values for various embodiments of a Schottky diode 100 will be discussed in the following paragraphs.

Figure 3:
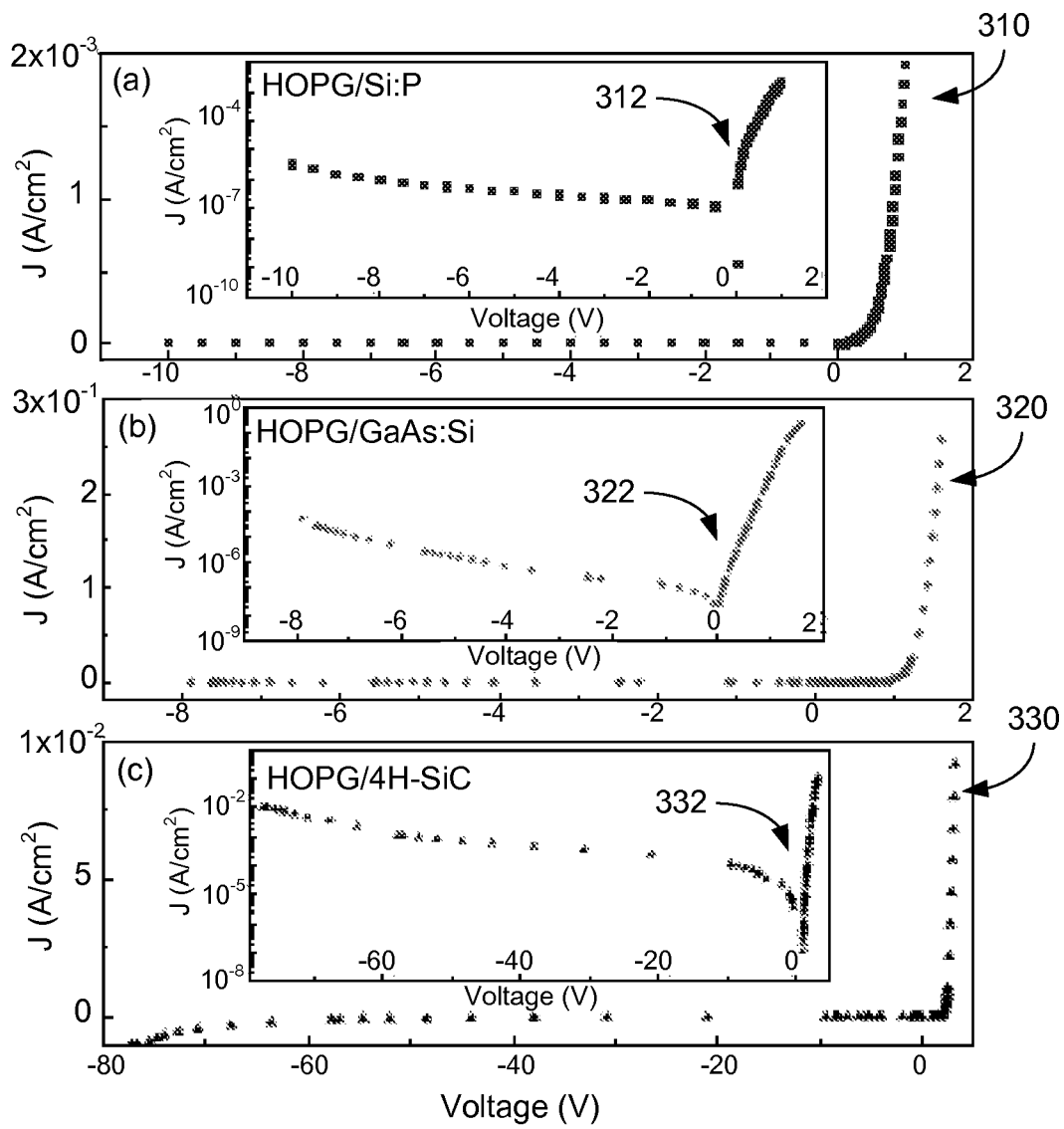
FIGS. 3-7 illustrate operational curves of various Schottky diodes of FIGS. 1A and 1B in accordance with various embodiments of the present disclosure.

FIG. 3 illustrates measured current density versus voltage (J-V) at room temperature for various embodiments of a Schottky diode 100a. The insets in FIG. 3 illustrate the J-V plots on semilogarithmic axes. The examples of FIG. 3 utilize a highly oriented pyrolytic graphite (HOPG) on substrates including, but not limited to, Si, GaAs, and 4H—SiC. FIG. 3(a) is a J-V graph 310 for an embodiment of the Schottky diode 100a in which the semiconductor layer 104 includes Si. The embodiment includes n-type Si with a $1\times10^{15}$ cm$^{-3}$ phosphorus (P) doping density. As can be seen in FIG. 3(a), this embodiment of the Schottky diode 100a exhibits 2-3 decades of linearity in the semilogarithmic J-V curve 312.

FIG. 3(b) is a J-V graph 320 for an embodiment of the Schottky diode 100a in which the semiconductor layer 104 includes n-type GaAs. The embodiment includes GaAs with a $3\times10^{16}$ cm$^{-3}$ Si doping density. As can be seen in FIG. 3(b), this embodiment of the Schottky diode 100a exhibits 6 decades of linearity in the semilogarithmic J-V curve 322.

FIG. 3(c) is a J-V graph 330 for an embodiment of the Schottky diode 100a in which the semiconductor layer 104 includes 4H—SiC. The embodiment includes a 5 μm-thick layer of doped epilayer ($1\times10^{16}$ cm$^{-3}$) deposited onto an insulating 4H—SiC substrate. As can be seen in FIG. 3(c), this embodiment of the Schottky diode 100a exhibits 4 decades of linearity in the semilogarithmic J-V curve 332.

The deviations in linearity between FIGS. 3(a), 3(b), and 3(c) can be attributed to the existence of more than one transport process, such as space-charge limited emission at low voltages and series resistance effects at higher voltages. As can be seen in FIG. 3, the embodiments of the Schottky diodes 100a exhibit good rectification at room temperature. For FIGS. 3(a), 3(b), 3(c), the rectification is preserved down to 20K.

When electron transport over the Schottky barrier height is dominated by thermionic emission, the semilogarithmic J-V curves (312, 322, 332) display a sufficiently linear portion in the forward bias region from which estimates of the zero bias barrier height and the ideality constant $\eta$ can be extracted. The extraction is based on the Richardson equation, $$I = I_s(T)[\exp(qV/\eta k_B T) - 1] \quad (1)$$

where $I_s = AA^*T^2 \exp(-q\phi_{B0}/k_B T)$ is the saturation current, $q\phi_B$ is the zero bias Schottky barrier height, $A^*$ is the Richardson constant, T is the absolute temperature, and V is the voltage across the ohmic contact layer 106 and semimetal stack 102 contact.

As can be seen in EQN. (1) above, extraction of a reliable value for the Schottky barrier height from EQN. (1) requires knowledge of the electrically active area A. For the semimetal stack 102, the active area A may not be accurately known due to the unknown contact areas of the semimetal stack 102 and the semiconductor layer 104. To remedy this situation, semilogarithmic isothermal current versus voltage (I-V) curves may be plotted, rather than J-V curves, and then $I_s(T)$ may be determined using extrapolation from linear regions of the curve to V=0. Analysis is facilitated by writing the equation for $I_s(T)$ in the form:

$$\ln[I_s(T)/T^2] = \ln(AA^*) - (q\phi_{B0}/k_B T) \quad (2)$$

where the unknowns A and $\phi_{B0}$ now appear in separate terms.

Figure 4:
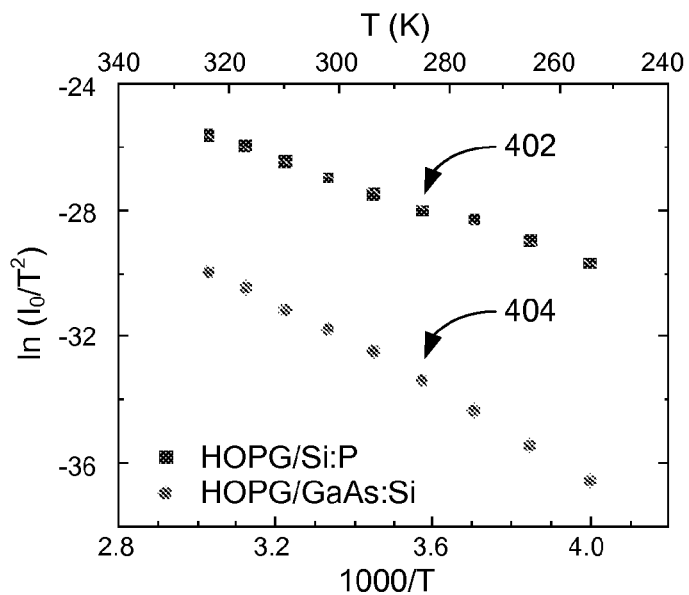

FIG. 4 is a graph illustrating a Richardson activation energy $\ln[I_s(T)/T^2]$ versus $T^{-1}$ over the temperature range of about 250 K to about 330 K for an embodiment of a Schottky diode 100a having a semiconductor layer 104 including n-type Si (curve 402) and an embodiment of a Schottky diode 100a having a semiconductor layer 104 including GaAs (curve 404). An effective Schottky barrier height for each of those embodiments may be calculated from the slopes to be 0.40 eV and 0.5 eV for a semiconductor layer 104 including Si (curve 402) and GaAs (curve 404), respectively.

The Schottky barrier height of a Schottky diode 100a may be measured using a capacitance versus voltage (C-V) measurement technique instead of the J-V measurement technique of FIG. 3. When measured capacitance of a Schottky diode 100a is plotted as an inverse square of capacitance ($1/C^2$) versus a reverse bias voltage ($V_R$), a linear dependence is observed. The intersection of a line drawn through the slope of the plotted $1/C^2$ versus $V_R$ curve with the abscissa of the plot yields a value of the built-in potential $V_{bi}$.

Figure 5:
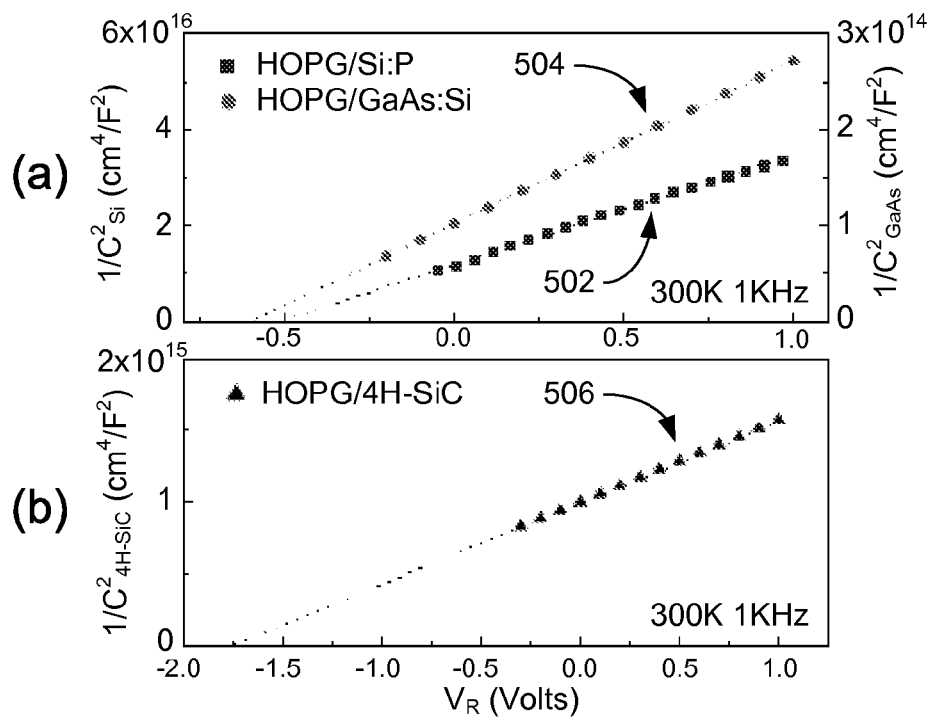

FIG. 5 is a graph of an inverse square of capacitance per unit area versus an applied reverse bias voltage ($1/C^2$–V) as measured on various embodiments of a Schottky diode 100a. The capacitance was measured at 1 kHz at room temperature (about 300 K). FIG. 5(a) includes a $1/C^2$–V curve 502 for an embodiment of the Schottky diode 100a in which the semiconductor layer 104 includes Si and a $1/C^2$–V curve 504 for an embodiment of the Schottky diode 100a in which the semiconductor layer 104 includes GaAs. FIG. 5(b) includes a $1/C^2$–V curve 506 for an embodiment of the Schottky diode 100a in which the semiconductor layer 104 includes 4H—SiC. The linearity of the $1/C^2$–V curves (502, 504, 506) indicates that gap states are absent and the surface density of states is small. Linear extrapolation (dotted lines) of curves 502, 504, and 506 to the intercept with the abscissa identifies the built-in potential $V_{bi}$.

Once the built-in potential $V_{bi}$ is known, one can determine the Schottky barrier height $\phi_B$ as follows:

$$\phi_B = V_{bi} + \frac{kT}{e}\ln\left(\frac{N_c}{N_d}\right). \quad (3)$$

As can be seen from EQN. (3), the Schottky barrier height is directly related to at least the following factors: the temperature T, the built-in potential $V_{bi}$, the effective density of states in the conduction band $N_c$, and the doping density of the semiconductor layer 104 $N_d$.

In some embodiments of the Schottky diode 100a, the semimetal stack 102 includes intercalated foreign impurity atoms. These foreign impurity atoms may be intercalated between the layers 102a, 102b, 102c, 102d or further intercalated within each layer 102a, 102b, 102c, 102d. The graphite layer 102a and the few-layer graphene layers 102b, 102c each include graphene layers ("graphene sub-layers"). The foreign impurity atoms may also be intercalated within these graphene sub-layers of layers 102a, 102b, 102c. The foreign impurity atoms attract electrons from neighboring graphene layers and/or graphene sub-layers, and thus "dope" the semimetal stack 102 with mobile carriers.

Although the semimetal stack 102 may be "doped" as described above, the semimetal stack 102 is impervious to the diffusion of other impurity atoms that are not intercalated within the semimetal stack 102 because the close packed honeycomb structure of graphene provides very little space for the impurity atoms to slip through. The doped semimetal stack 102 conducts electricity along the planes of the atom layers but does not conduct or conducts at a reduced level in a direction orthogonal to those planes. Examples of impurity atoms include, but are not limited to, bromine, potassium, rubidium, cesium, lithium, $SbCl_5$, $SO_3$, $SbF_5$, Fluoride, ICl, IBr, and one or more of a variety of impurity atoms.

Figure 6:
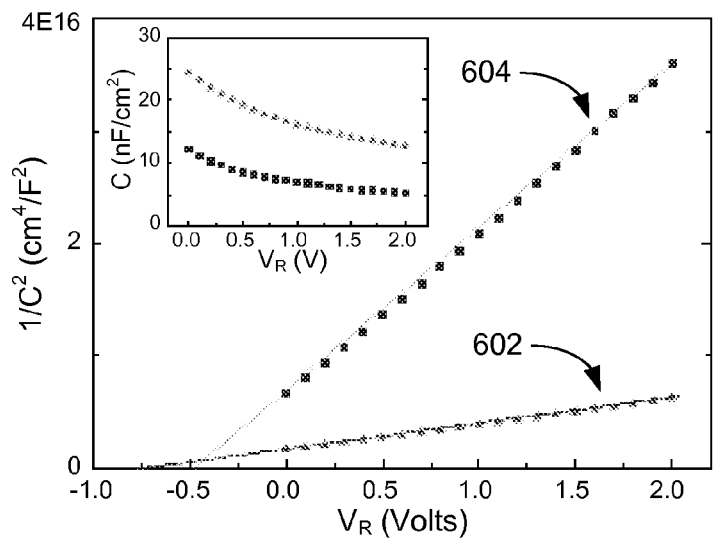

FIG. 6 is a graph of a $1/C^2$–V curve 602 measured for an embodiment of a Schottky diode 100a including a doped semimetal stack 102 and a $1/C^2$–V curve 604 measured for embodiment of a Schottky diode 100a including an undoped semimetal stack 102. The measurements of capacitance were taken at a frequency of 1 kHz at room temperature. Based on the $1/C^2$–V curve in FIG. 6 and the calculations of Schottky barrier height discussed above, the Schottky diode 100a including an undoped semimetal stack 102 (curve 604) has a $V_{bi}$ of about 0.40 eV to about 0.60 eV, which corresponds to a Schottky barrier height of about 0.54-0.74 eV. Further, the Schottky diode 100a including a doped semimetal stack 102 (curve 602) has a $V_{bi}$ of about 0.60 eV to about 0.90 eV, which corresponds to a Schottky barrier height of about 0.74-1.04 eV. Accordingly, the "doping" of the semimetal stack 102 of the Schottky diode 100a results in an increase (e.g., about 0.3-0.4 eV) of the Schottky barrier height. This change in the Schottky barrier height gives rise to exponentially sensitive changes in the current-voltage characteristics of the Schottky diode 100a.

Moreover, because the Schottky barrier height depends on the doping of the semimetal stack 102 and because the amount of "doping" may be controlled, the Schottky barrier height can be tuned. Tuning by doping achieves a greater increase in the Schottky barrier height than tuning by applying pressure on the junction or by controlling the crystal structure and grain size of metal electrodes, which result in changes corresponding to voltages less than or equal to 50 mV.

Figure 7:
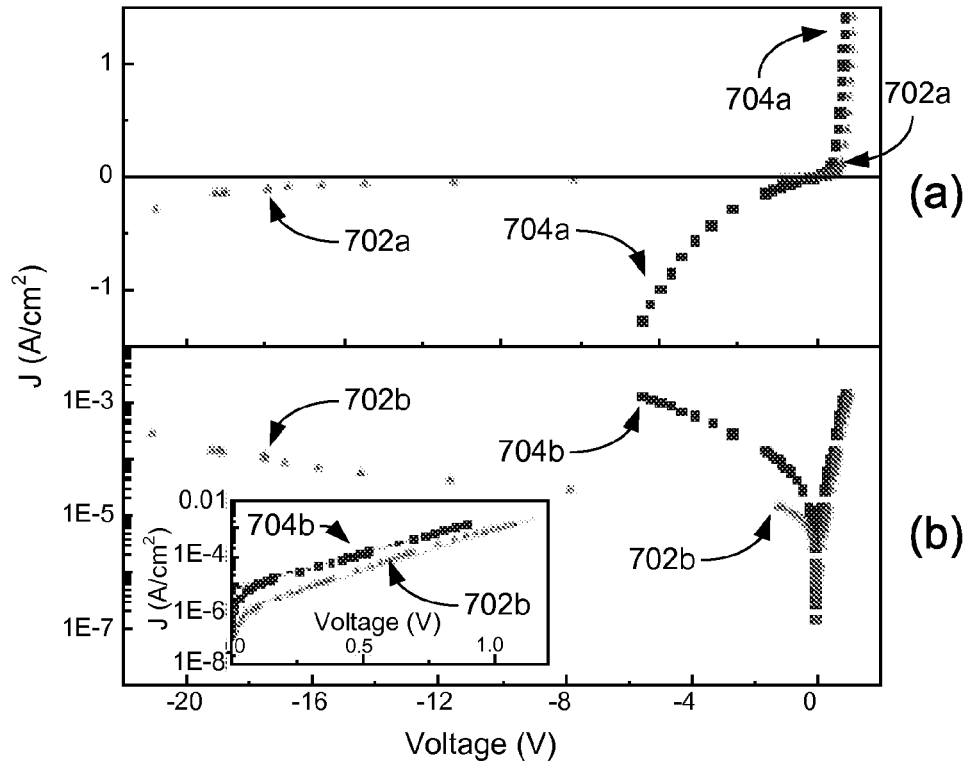

FIG. 7 illustrates a J-V curve 702 measured for an embodiment of a Schottky diode 100a that includes a doped semimetal stack 102 and a J-V curve 704 measured for embodiment of a Schottky diode 100a that includes an undoped semimetal stack 102. FIG. 7(a) illustrates the J-V curves 702a and 704b on a linear scale whereas FIG. 7(b) illustrates the J-V curves 702b and 704b on a semilogarithmic scale. As can be seen in FIG. 7, the embodiment of a Schottky diode 100a including a doped semimetal stack 102 (curve 702) has a greater breakdown voltage, higher power gain, and lower leakage current and noise than the embodiment of a Schottky diode 100a including an undoped semimetal stack 102 (curve 704).

Schottky diodes 100a having a semiconductor layer 104 including Si may be useful in applications including Schottky diode-based field effect transistors, MESFETs, metal-oxide-semiconductor field effect transistors (MOSFETs), solar cells, and other silicon technologies. Graphene based silicon solar cells are desired and can be optimized since graphene electrodes are optically transparent and the solar cell device characteristics can easily be modified using doping techniques described above. Those Schottky diodes 100a having a semiconductor layer 104 including GaAs may be useful in spintronic and optical applications since GaAs has a direct band gap. Additionally, Schottky diodes 100a having a semiconductor layer 104 including SiC may be useful in high power/high frequency devices since SiC has high thermal conductivity and breakdown strength. Also, Schottky diodes 100a having a semiconductor layer 104 including GaN may be useful in high temperature, high frequency devices as well as light emitting diodes (LED) and optical device applications due to the direct band gap properties of GaN.

Figure 8:
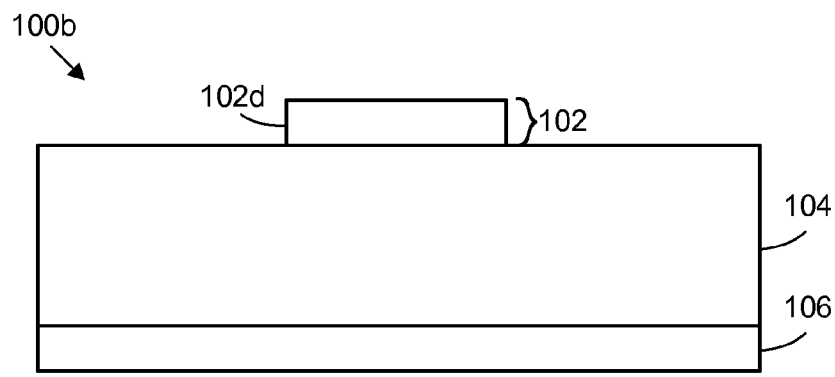
FIG. 8 is a graphical representation of an example of a Schottky diode including a zero gap semiconductor in accordance with various embodiments of the present disclosure.

FIG. 8 is a cross-sectional view of another embodiment of a Schottky diode 100, denoted in FIG. 8 as 100b. The embodiment illustrated in FIG. 8 is similar to the embodiments illustrated in FIGS. 1A and 1B except that the semimetal stack 102 includes a zero gap semiconductor (ZGS) layer (e.g., a graphene layer) 102d but not a graphite layer 102a or "few-layer" graphene layers 102b, 102c to form a ZGS semiconductor device. Since the Schottky barrier height is related to an interfacial dipole layer associated with bond polarization, the Schottky barrier properties are likely determined primarily by the outermost layer of the semimetal stack 102, which is the graphene layer 102d. Since the outermost layer of graphite is a single sheet of graphene, the Schottky diodes 100 of FIGS. 1A, 1B and 8 may have similar behavior because each Schottky diode 100 includes a Schottky barrier formed by a ZGS (graphene) layer 102d and a semiconductor layer 104. Furthermore, there is ARPES evidence for the precursor influence of K-point Dirac fermions and a pronounced temperature-dependent upturn in the in-plane resistivity ($\rho_{ab}$) in the 300K<T<900 K temperature range where the next-tonearest neighbor couplings can be ignored so that the semimetal stack 102 may be described as a stack of graphene bilayers. Similar to the Schottky diode 100a, the highest temperatures at which the Schottky diode 100b can operate depends on the semiconducting material included in the semiconductor layer 104 and its interaction with the ZGS layer 102d. The ZGS layer 102d may be doped by depositing an atomically thin dopant such as, but not limited to, Gold(III) Chloride or Bis(trifluoromethanesulfonyl)amine onto the graphene. The ZGS layer 102d may also be doped with absorbed gases or other absorbants. This step allows the graphene to interact with the atomically thin dopant and change the Fermi level and thus the work function of graphene, thereby allowing tuning of the Schottky barrier height of the ZGS semiconductor device.

Figure 9:
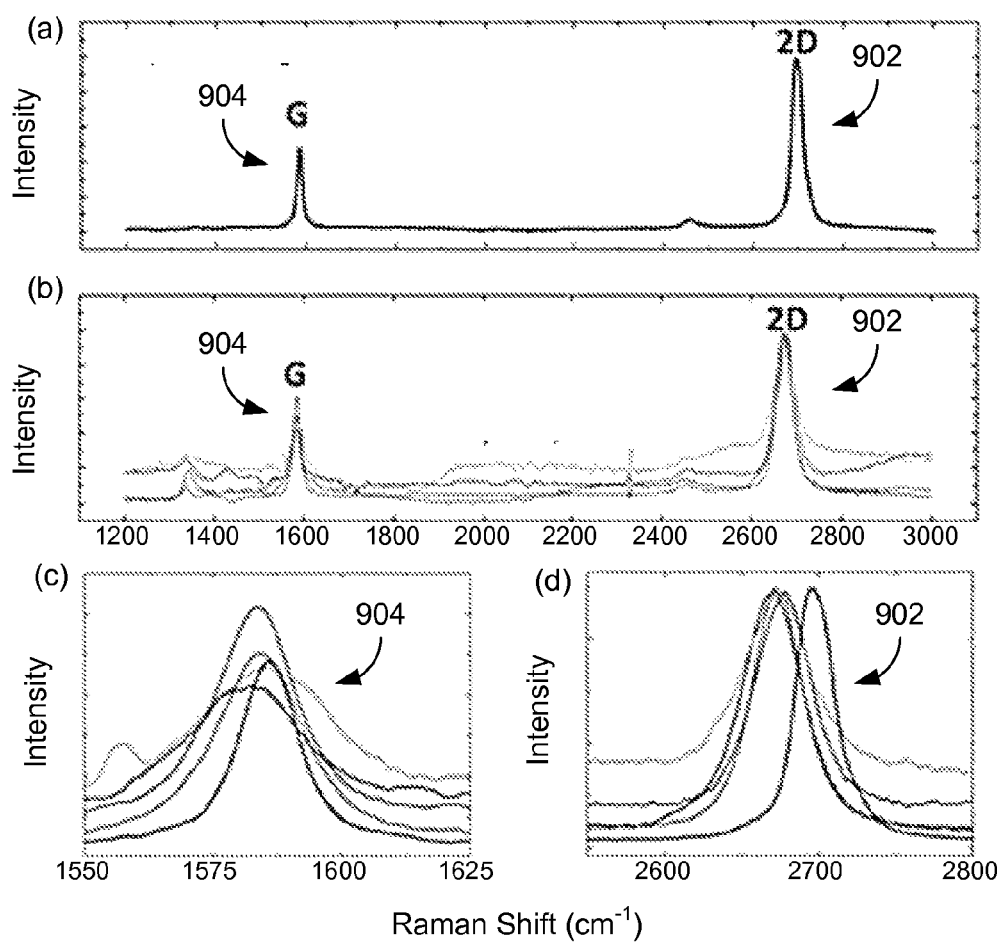
FIG. 9 illustrates Raman shift spectra for a zero gap semiconductor of FIG. 8 in accordance with various embodiments of the present disclosure.

Referring now to FIG. 9, shown is Raman spectroscopy data taken on graphene sheets grown on copper (Cu) foils by chemical vapor deposition (CVD). The quality of graphene sheets may be measured by a large 2D 902 to G 904 intensity ratio ($I_{2D}/I_G$) and a low D peak intensity ($I_D$). Single layer graphene is expected to show $I_{2D}/I_G>2$, and the amount of disorder in the graphene sheets is often correlated with $I_D$. In the example of FIG. 9(a), the intensity ratio is $I_{2D}/I_G \geq 2$ and a negligible D peak amplitude is present. However, after a graphene sheet is transferred to a semiconductor substrate, $I_D$ may become more pronounced while $I_{2D}/I_G$ remains about the same as illustrated in FIG. 9(b). FIGS. 9(c) and 9(d) illustrate the variations in G 904 and 2D 902 with different substrate materials (i.e., 4H—SiC, Si, GaN, and GaAs). The increase in $I_D$ may reflect a lower sheet mobility of CVD-grown graphene, which may give rise to weak localization effects at low temperatures. The Hall mobility of the graphene sheets used in the diodes is in the range of about 1400 to about 2000 cm$^2$/Vs, and the graphene sheets are hole doped with carrier densities in the range of about $2\text{-}8\times10^{12}$ cm$^{-2}$.

Figure 10:
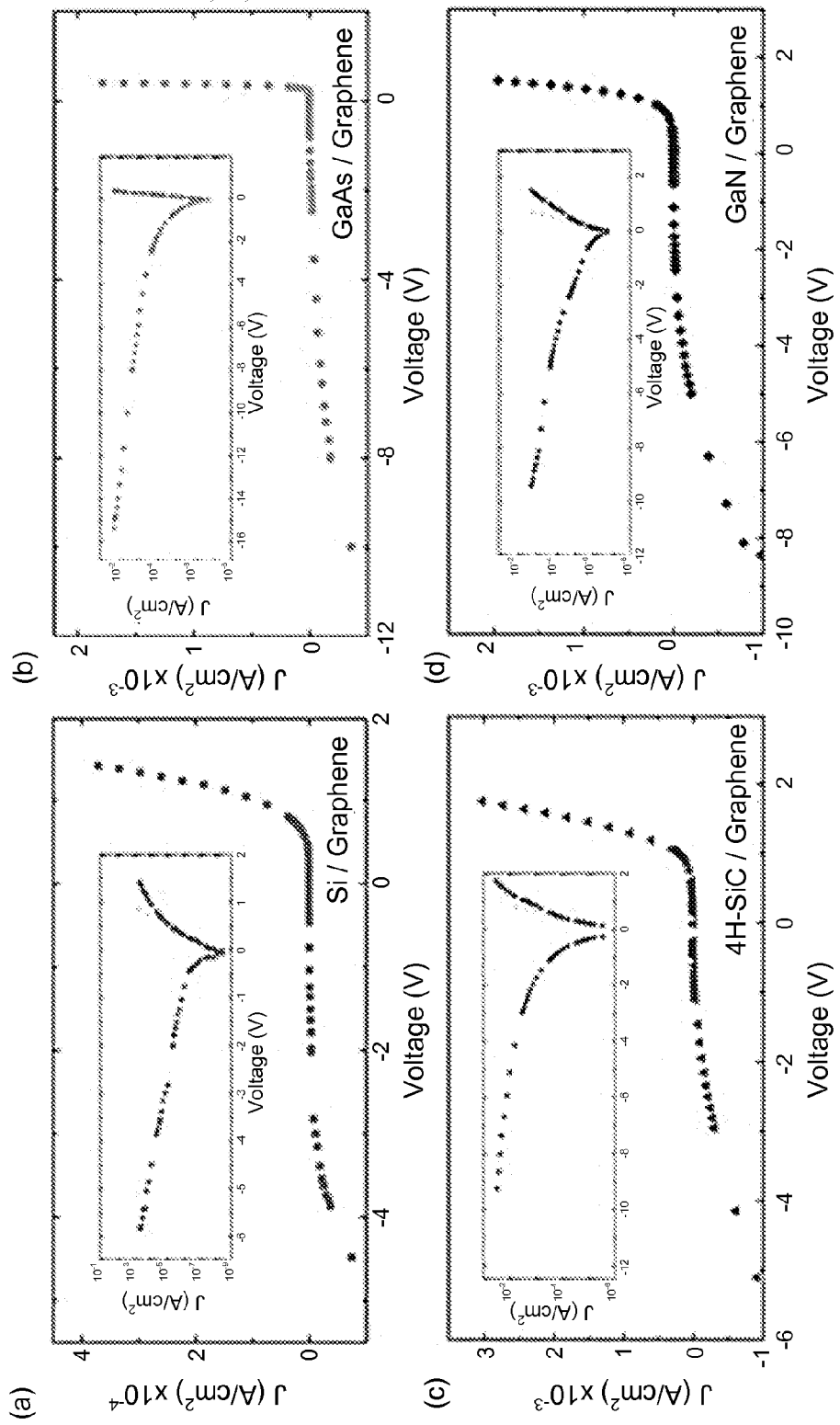
FIGS. 10-12 illustrate operational curves of various Schottky diodes of FIG. 8 in accordance with various embodiments of the present disclosure.

FIG. 10 illustrates the measured current density versus voltage (J-V) for various embodiments of a Schottky diode 100b of FIG. 8 including the ZGS (graphene) layer 102d. The insets in FIG. 10 illustrate the J-V plots on semilogarithmic axes. FIG. 10(a) depicts a J-V curve for a diode with a Si substrate, FIG. 10(b) depicts a J-V curve for a diode with a GaAs substrate, FIG. 10(c) depicts a J-V curve for a diode with a 4H—SiC substrate, and FIG. 10(d) depicts a J-V curve for a diode with a GaN substrate.

Schottky diodes with n-type or p-type semiconductors are expected to pass current in the forward bias (e.g., when a n-type semiconductor is negatively biased) while becoming highly resistive in reverse bias (e.g., when a n-type semiconductor is positively biased). As seen from the plots of J-V data taken on various graphene/n-type semiconductor junctions (i.e., Si, GaAs, 4H—SiC, Si, and GaN), the examples display strong rectification. This rectification is a consequence of Schottky barrier formation at the interface when electrons flow from the semiconductor layer 104 to the graphene (ZGS) layer 102d as the Fermi energies equilibrate. The J-V curves exhibit properties that are similar to the J-V graphs of FIG. 3. When electronic transport across the barrier is dominated by thermionic emission described by EQN. 1, the inset semilogarithmic plots of the J-V curves display a linear region in forward bias. As seen in the inset curves of FIG. 10, the straight line segments reveal 2-4 decades of linearity, thus allowing for extraction of $J_s$ (or $I_s$) and η for a diode. The deviations from linearity at higher bias are due to series resistance contributions from the respective semiconductors.

Figure 11:
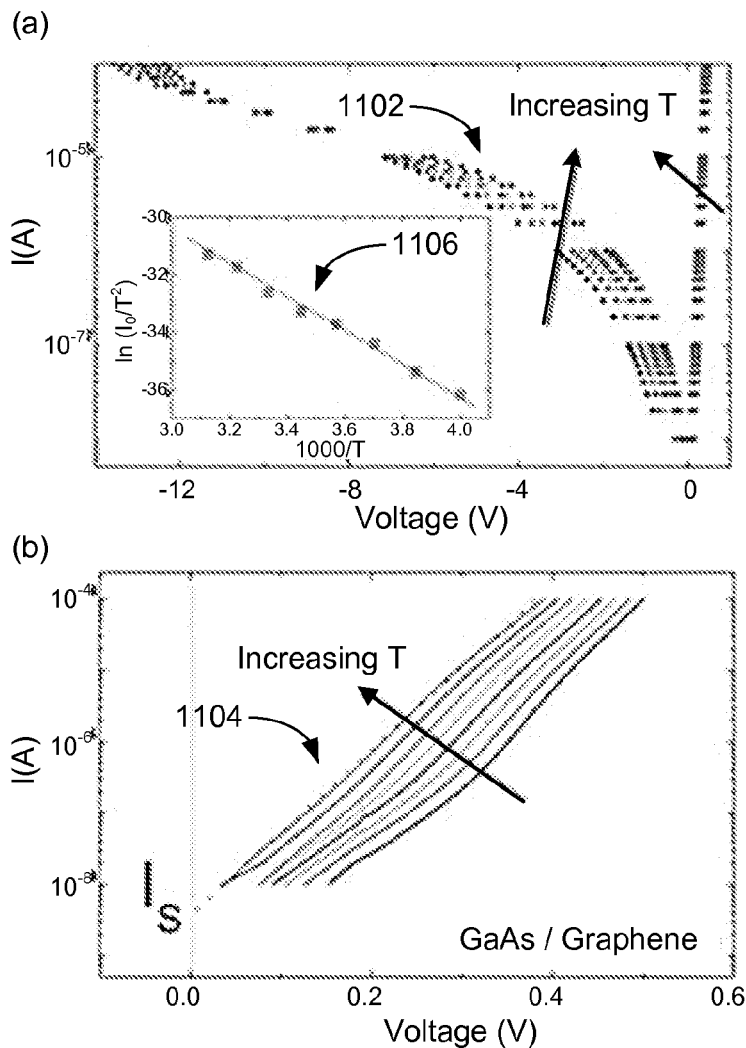

Referring to FIG. 11(a), the temperature-dependent data curves 1102 for a ZGS Schottky diode 100b with a graphene/GaAs junction show that for both bias directions, a larger current flows as the temperature is increased and the probability of conduction electrons overcoming the barrier increases. In a forward bias, the thermionic emission manifests itself as a series of linear J-V curves 1104 when plotted on the semilogarithmic axes of FIG. 11(b) and a linear a Richardson activation energy ln $[I_s(T)/T^2]$ versus $T^1$ curve 1106 shown in the inset of FIG. 11(a). An effective Schottky barrier height for the embodiment may be calculated from the slope of this linear dependence as discussed above. Repeating these temperature-dependent measurements for the four different examples of the ZGS Schottky diode 100b, the Schottky barrier height values at the graphene (ZGS) layer 102d and semiconductor layer 104 interfaces are about 0.86 eV, about 0.79 eV, about 0.91 eV and about 0.84 eV for Si, GaAs, 4H—SiC, and GaN substrates, respectively. While the overall reverse current density increases as T is increased, it can be seen that the breakdown voltage increases linearly with temperature implying that the breakdown voltage has a positive breakdown coefficient and that the junction breakdown mechanism is mainly avalanche multiplication.

Unlike conventional metals, the graphene work function is a function of bias and for large voltage values the Schottky barrier height does not stay constant. When ZGS Schottky diodes 100b are forward biased, they pass large currents at voltages below about 1 V and therefore the changes in the Fermi level ($E_F$ of FIG. 2) of graphene may be neglected. However, in reverse bias where the applied voltage can be larger than 5 V, $E_F$ starts changing and the fixed Schottky barrier height assumption no longer holds. In reverse bias when the graphene electrodes are negatively charged, $E_F$ increases and the graphene work function decreases causing the Schottky barrier height to decrease as the reverse bias is increased. As illustrated by the insets of FIG. 10, this effect causes the total reverse current to increase as the magnitude of the bias is increased, thus preventing the Schottky diode from reaching reverse saturation current.

Figure 12:
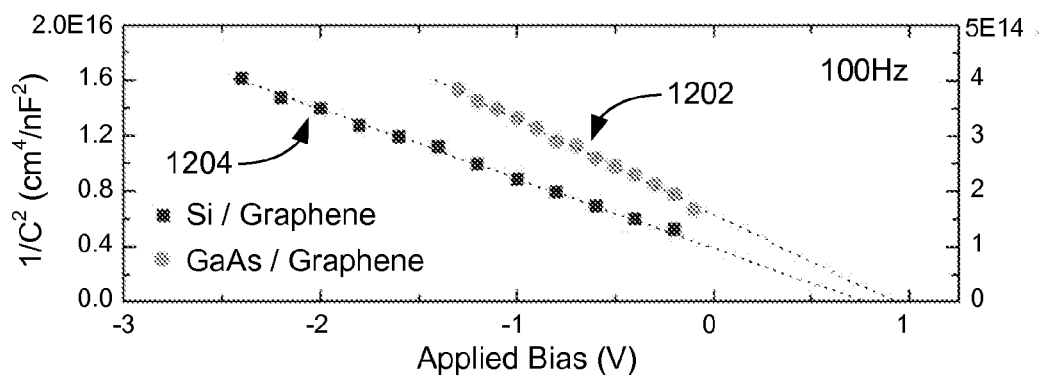

Capacitance-voltage C-V measurements made in the reverse bias mode are complementary to J-V measurements and provide useful information about the distribution and density $N_d$ of ionized donors in the semiconductor and the magnitude of the built-in potential $V_{bi}$. For a uniform distribution of ionized donors within the depletion width of the semiconductor 104, the Schottky-Mott relationship between the $1/C^2$ and the reverse bias voltage $V_R$, satisfies the linear relationship $1/C^2=2(V_R-V_{bi})/eN_D\epsilon_s$. FIG. 12 is a graph of an inverse square of capacitance per unit area versus an applied reverse bias voltage ($1/C^2$–V) as measured on a GaAs embodiment (curve 1202) and a Si embodiment (curve 1204) of a ZGS Schottky diode 100b of FIG. 8. Linear extrapolation of the curves 1202 and 1204 to the intercept with the abscissa gives the built-in potential, $V_{bi}$, which is related to Schottky barrier height via EQN. 3. The Schottky barrier height values at the graphene (ZGS) layer 102d and semiconductor layer 104 interfaces were about 0.92 eV and about 0.91 eV for the Si and GaAs embodiments, respectively.

The Schottky barrier height values are higher than the Schottky barrier height values determined based upon the J-V technique discussed above (FIG. 11(a) insert). The discrepancy between the Schottky barrier heights determined by the two methods may be attributed to: (a) the existence of a thin oxide or residue at the interface between the graphene layer 102 and the semiconductor layer 104, and/or (b) Schottky barrier inhomogeneity. An important difference between the C-V and J-V techniques is that the C-V measurements probe the average junction capacitance at the interface and thereby yielding an average value for the Schottky barrier height, while the J-V measurements give a minimum value for the Schottky barrier height since electrons with tunneling probabilities that are exponentially sensitive to barrier heights, choose low barrier patches over higher patches.

Additionally, Raman measurements taken on brominated graphite show vibrational modes specific to graphene. After the bromination, the distance between the graphene layers in the graphite layers of the semimetal stack 102 increases and coupling between consecutive layers starts to become negligible. The graphite begins to behave as graphene as the coupling becomes smaller upon bromine intercalation. Accordingly, brominated graphite approaches the behavior of graphene after the intercalation of bromine atoms. Thus, the Schottkey barrier height of a semiconductor device may be tuned through bromination or the use of other absorbates or solutions.

Figure 13A:
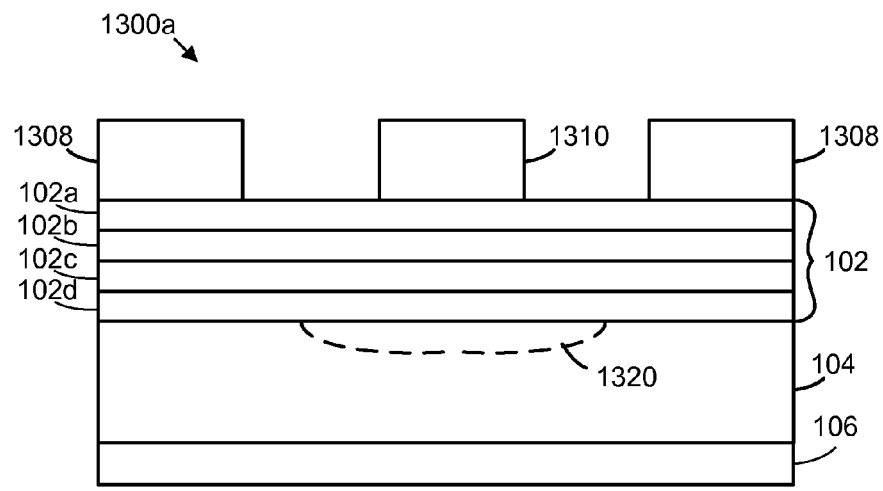
FIGS. 13A-13B and 14A-14B are graphical representations of examples of a semimetal-semiconductor field effect transistor (SMESFET) and a zero gap semiconductor field effect transistor (ZGSFET) in accordance with various embodiments of the present disclosure.
Figure 13B:
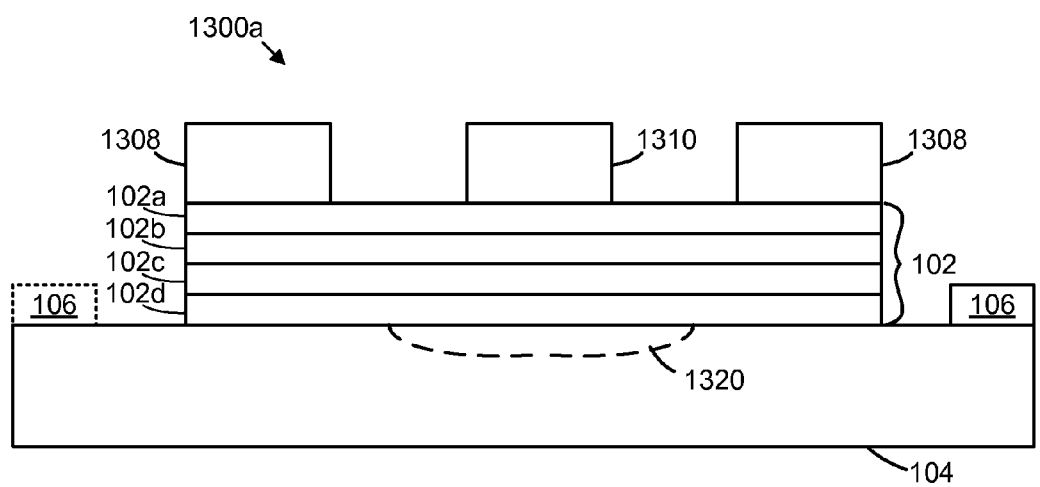

FIGS. 13A and 13B are cross-sectional views of embodiments of a semimetal-semiconductor field effect transistor (SMESFET) 1300a including a semimetal stack 102. The embodiment of a SMESFET 1300a is similar to the Schottky diode 100a illustrated in FIG. 1A, but the SMESFET 1300a further includes two electrodes 1308 and a counter electrode 1310 positioned between the two electrodes 1308. The junction of the semimetal/zero gap semiconductor layer 102d of the semimetal stack 102 and the semiconductor layer 104 in the Schottky diode 100a forms a Schottky barrier.

Figure 14A:
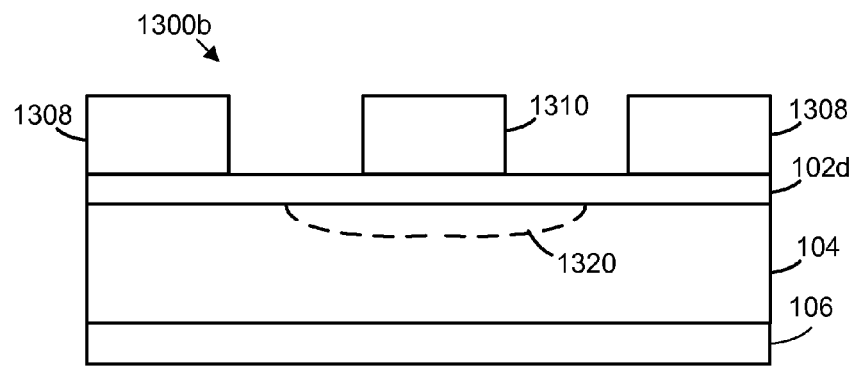
Figure 14B:
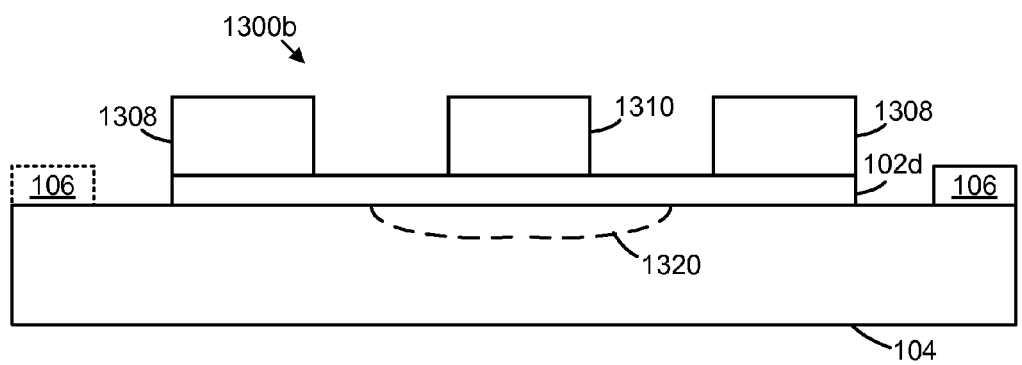

Similarly, FIGS. 14A and 14B are cross-sectional views of embodiments of a zero gap semiconductor-semiconductor field effect transistor (ZGSFET) 1300b including a ZGS layer 102d without a graphite layer 102a or "few-layer" graphene layers 102b, 102c to form the ZGS semiconductor device. The embodiment of a ZGSFET 1300b illustrated in FIGS. 14 A and 14B are similar to the ZGS Schottky diode 100b illustrated in FIG. 8, but the ZGSFET 1300b further includes two electrodes 1308 and a counter electrode 1310 positioned between the two electrodes 1308.

Additionally, the ohmic contact layer 106 of FIGS. 1A, 1B and 8 need not but may be included in a SMESFET/ZGSFET 1300. The examples of embodiments of a SMESFET/ZGSFET 1300 illustrated in FIGS. 13A-13B and 14A-14B include an ohmic contact layer 106. The semimetal stack 102 or ZGS layer 102d may be on the side opposite the ohmic contact layer 106 as illustrated in FIGS. 13A and 14A or may be on the same side as, but separated from, the ohmic contact layer 106 as illustrated in FIG. 13B or 14B. The counter electrode 1310 may be thought of as a gate electrode. In a SMESFET/ZGSFET 1300, a reversed-biased depletion zone 1320 controls the conductivity of a channel.

In some embodiments, the semiconductor layer 104 of the SMESFET/ZGSFET 1300 includes SiC, GaAs, and/or GaN. SiC, GaAs, and/or GaN are examples of semiconducting materials that do not oxidize in the presence of air. Therefore, there is no established or generally accepted oxide formed on SiC, GaAs, and GaN. In the absence of such oxide, MOSFET geometry cannot be used to drive current to and from on and off states. Hence, Schottky barrier formation enables these semiconducting materials to be used in on-off devices. Moreover, graphite and/or graphene based Schottky diodes 100 (FIGS. 1 and 8) and/or SMESFETs/ZGSFETs 1300 (FIGS. 13A-13B and 14A-14B) formed on those SiC, GaAs, or GaN further include a Schottky barrier height that can be adjusted for a variety of electronics purposes.

In some embodiments, the electrodes 1308 include a metal, and the electrodes 1308 may be lithographically patterned in deposited metal. The electrodes 1308 may be used for in-plane electron transport measurements, and the counter electrode 1310 may be used for vertical (i.e., orthogonal to plane) electron transport measurements. Reverse biasing can electrically isolate the graphene layer 102d and allow for observation of transport characteristics and the implementation of other device concepts developed for single graphene sheets on oxidized silicon and hence not in intimate contact with the underlying semiconductor.

SMESFETs/ZGSFETs 1300 may be useful in sensing and detecting technologies where control of the physical properties of the graphite and/or graphene, and hence the Schottky barrier, enable efficient operation of the transistor. For example, when the SMESFET/ZGSFET 1300 is forward biased at constant voltage, the current is exponentially sensitive to the Schottky barrier height. Since Schottky barrier height is primarily determined by electric dipole layers associated with bond polarization and since the graphene layer 102d is one atom thick, a strong perturbation of bonding strength (hence, the Schottky barrier height) is expected in the presence of foreign atoms on the graphene layer 102d surface. Therefore, the exponential sensitivity of the I-V characteristics to the Schottky barrier height and thus irreversibly deposited contacting metals and/or to reversibly absorbed foreign species suggests a new generation of sensors and electronic devices.

As mentioned above, in some embodiments, the SMESFET/ZGSFET 1300 has a semiconductor layer 104 including GaN. These embodiments of a SMESFET/ZGSFET 1300 are particularly useful in applications that having high temperatures and high frequencies, such as national security military applications. In fact, these embodiments of a SMESFET/ZGSFET 1300 are stable at about 900° C. and have a high reverse voltage breakdown of about 100V or greater. In contrast, the temperature range of metal semiconductor field effect transistors (MESFETs) using conventional metals is more limited.

Figure 15:
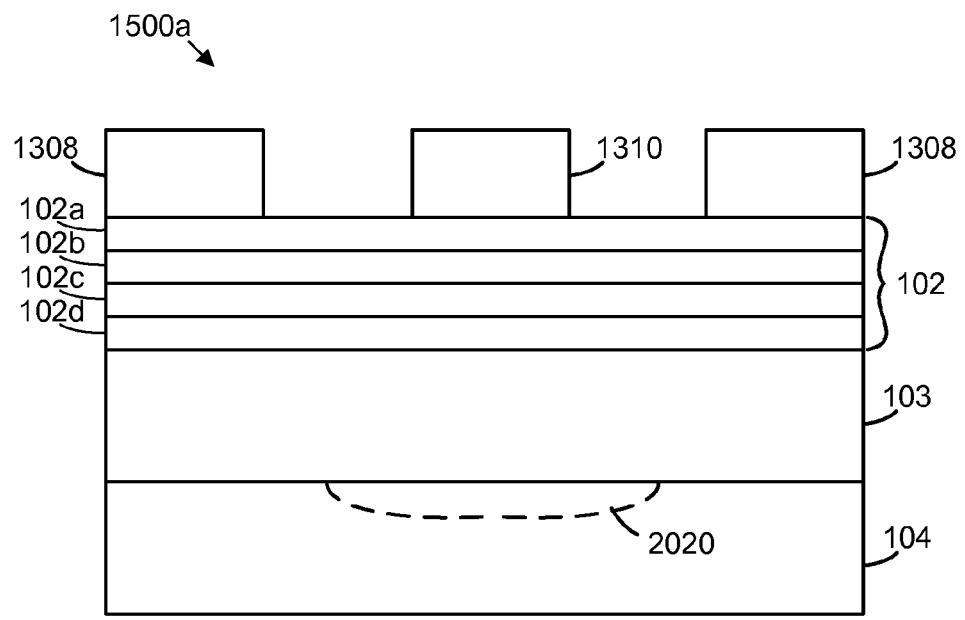
FIGS. 15-16 are graphical representations of examples of a high electron mobility transistor (HEMT) in accordance with various embodiments of the present disclosure.
Figure 16:
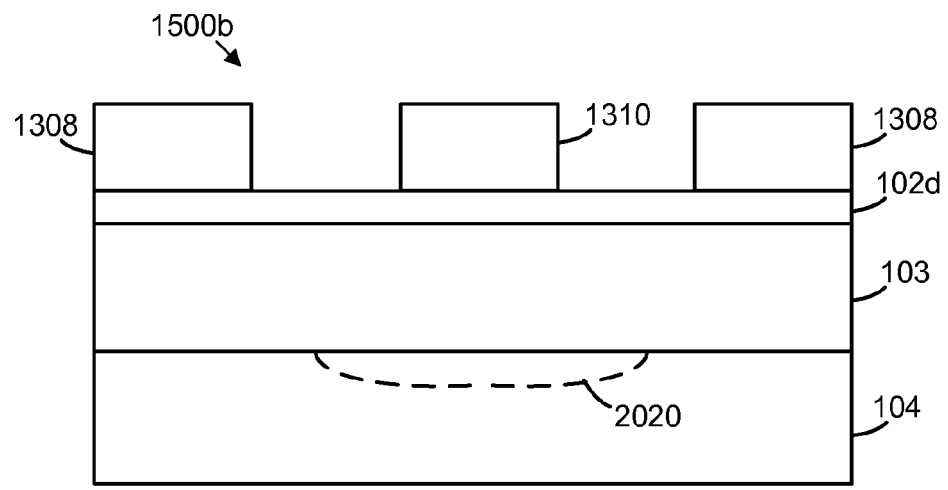

Schottky barriers formed by a semimetal stack 102 and a semiconductor layer 104 may be useful in devices other than Schottky diodes 100 and SMESFETs/ZGSFETs 1300. For example, a high electron mobility transistor (HEMT) may include a Schottky barrier including a semimetal stack 102 and/or a zero gap semiconductor (ZGS) layer 102d. FIGS. 15 and 16 are cross-sectional views of various embodiments of a HEMT 1500. The embodiment of a HEMT 1500a illustrated in FIG. 15 is similar to the embodiment of a SMESFET 1300a illustrated in FIG. 13A, except that the embodiment of a HEMT 1500a includes an additional semiconductor layer 103. The semimetal stack 102 is deposited on the additional semiconductor layer 103. Similarly, the embodiment of a ZGS HEMT 1500b illustrated in FIG. 16 is similar to the embodiment of a ZGSFET 1300b illustrated in FIG. 14A, except that the embodiment of a HEMT 1500b includes an additional semiconductor layer 103. A ZGS layer 102d without a graphite layer 102a or "few-layer" graphene layers 102b, 102c is deposited on the additional semiconductor layer 103 to form the ZGS semiconductor device.

In some embodiments of a HEMT 1500, a first semiconductor layer 104 includes GaAs and a second semiconductor layer 103 includes AlGaAs. In other embodiments, the first semiconductor layer 104 and the second semiconductor layer 103 include other semiconducting materials having different band gaps. Additionally, in the illustrated in embodiments of a HEMT 1500, the channel 2020 is formed at the junction between the first semiconductor layer 104 and the second semiconductor layer 103 instead of at the junction between the semiconductor layer 104 and the semimetal stack 102 as in the illustrated embodiments of a SMESFET/ZGSFET 1300.

HEMTs 1500 heavily rely on the Schottky barrier characteristics in between semimetal stack 102 (including graphite and/or graphene) and the first semiconductor layer 104 and a second semiconductor layer 103. Formation of a Schottky barrier using graphite in the semimetal stack 102 allows the Schottky barrier height to be adjustable upon intercalation. Any control over the Schottky barrier height means that turn on-off bias can be adjusted in the HEMT 1500. Graphite and/or graphene based HEMTs 1500 formed on SiC, GaAs, or GaN further include a Schottky barrier height that can be adjusted for a variety of electronics purposes. Moreover, capacitance formed at the depletion width of the Schottky barrier can be tuned by various intercalants. The inclusion of a Schottky barrier formed by the semimetal stack 102 and the semiconductor layers 103, 104 may allow the HEMT 1500 to operate faster.

Figure 17:
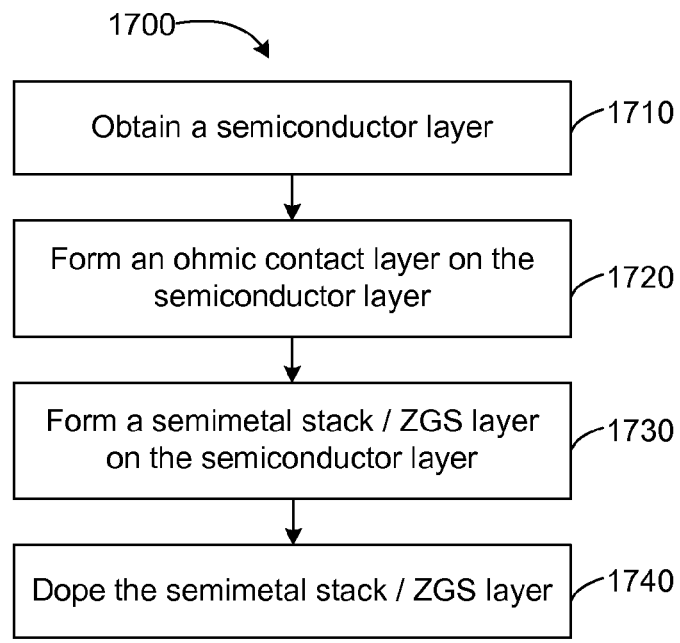
FIGS. 17-20 are flowcharts illustrating the fabrication of the semiconductor devices of FIGS. 1A, 1B, 8, and 13A-16 layer in accordance with various embodiments of the present disclosure.

Having described various embodiments of Schottky diodes 100, SMESFETs 1300, and HEMTs 1500 above, methods of fabricating those devices will now be discussed. For example, FIG. 17 is a flow chart illustrating an embodiment of a method 1700 of fabricating a Schottky diode 100. In block 1710, a semiconductor layer 104 is obtained, and in block 1720, an ohmic contact layer 106 is formed on the semiconductor layer 104. The semiconductor layer 104 includes a semiconducting material such as, but not limited to, Si, GaAs, 4H—SiC, and GaN.

In block 1730, a semimetal stack 102 or a ZGS layer 102d is formed on the semiconductor layer 104. The semimetal stack 102 or ZGS layer 102d may be on the side opposite the ohmic contact layer 106 as illustrated in FIG. 1A or may be on the same side as, but separated from, the ohmic contact layer 106 as illustrated in FIG. 1B. For example, the semimetal stack 102 or ZGS layer 102d may be formed adjacent to or at least partially encircled by the ohmic contact layer 106. The semimetal stack 102 includes graphite and/or graphene. The semimetal stack 102 may be formed by depositing graphite on the semiconductor layer 104. The graphite may be deposited by applying a dab of graphite paint followed by mechanical exfoliation. The graphite paint may be a mixture of residue-free 2-butoxyethyl acetate and octyl acetate with graphite powder collected from cutting highly oriented pyrolytic graphite (HOPG) by diamond impregnated wire. After mechanical exfoliation, multi-layer graphite flakes flatten out on the surface of the semiconductor layer 104 due to Van der Waals forces. In some embodiments, the graphite may be deposited onto nickel foils/substrates by chemical vapor deposition followed by regular transfer process. In other embodiments, one or more sheet(s) of graphene may be deposited on the semiconductor layer 104. For example, a single sheet of graphene may be deposited on the semiconductor layer 104 to form the ZGS layer 102d. The graphene may be grown onto copper foils using chemical vapor deposition and may be deposited onto various substrates by spin coating PMMA onto copper foil and chemically etching the foils from the backside and transferring PMMA/graphene foils onto the substrates.

These ways of depositing the graphite and/or graphene do not substantially alter the interface between the semimetal stack 102 and the semiconductor layer 104. Further, these ways of depositing graphite do not introduce defects and surface states that may cause the Schottky diodes 100 (FIGS. 1A, 1B and 8) or SMESFETs/ZGSFETs 1300 (FIGS. 13A-14B) to have slower responses.

Additionally, in some embodiments, such as the one illustrated in FIG. 17, the semimetal stack 102 is doped by intercalating dopant atoms within the semimetal stack 102 as indicated in block 1740. For example, the semimetal stack 102 may include bromine intercalated by "direct bromine" gas exposure on a graphite flake and/or graphite paint within a closed container. As another example, graphite powder may be bromine intercalated prior to mixing with organic solvents to form graphite paint. In such case, block 1740 would be performed prior to block 1730. A ZGS layer 102d may be doped by using spin coating techniques to deposit atomically thin dopants such as, e.g., Gold(III)Chloride, Bis(trifluoromethanesulfonyl)amine, and other organic solutions onto the graphene sheet. The ZGS layer 102d may also be doped with absorbed gases or other absorbants.

Figure 18:
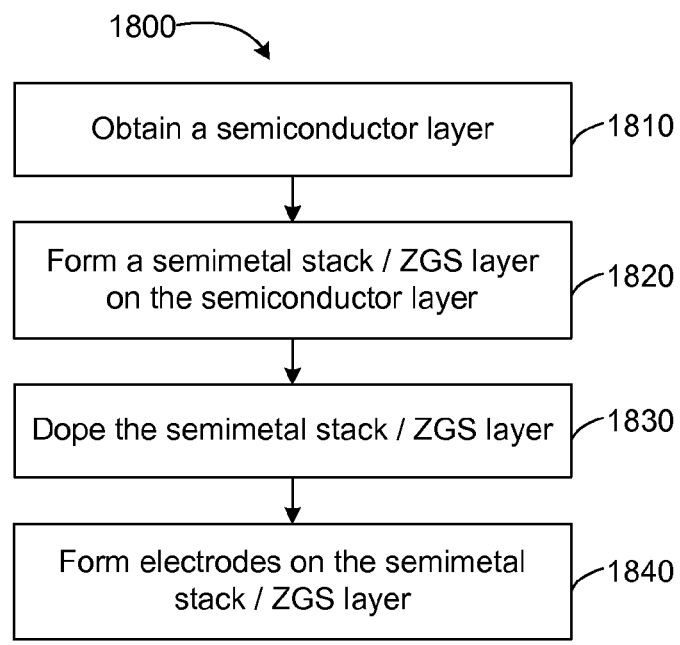

As another example, FIG. 18 is a flow chart illustrating an embodiment of a method 1800 of fabricating a SMESFET/ ZGSFET 1300 (FIGS. 13A-14B). In block 1810, a semiconductor layer 104 is obtained. The semiconductor layer 104 includes a semiconducting material such as, but not limited to, Si, GaAs, 4H—SiC, and GaN. In block 1820, a semimetal stack 102 or a ZGS layer 102d is formed on the semiconductor layer 104. The semimetal stack 102 includes graphite and/or graphene. In some embodiments, one or more sheet(s) of graphene may be deposited on the semiconductor layer 104. For example, a single sheet of graphene may be deposited on the semiconductor layer 104 to form the ZGS layer 102d without a graphite layer 102a or "few-layer" graphene layers 102b, 102c. Block 1820 is the same as block 1730 in FIG. 17.

Additionally, in some embodiments, such as the one illustrated in FIG. 18, the semimetal stack 102 is doped by intercalating dopant atoms within the semimetal stack 102 or coating the ZGS layer 102d as shown in block 1830. Block 1830 is the same as block 1740 in FIG. 17. In block 1840, two electrodes 1308 (FIGS. 13A-14B) and a counter electrode 1310 (FIGS. 13A-14B) are formed on the semimetal stack 102 or the ZGS layer 102d. The counter electrode 1310 is positioned on the semimetal stack 102 between the two electrodes 1308.

Figure 19:
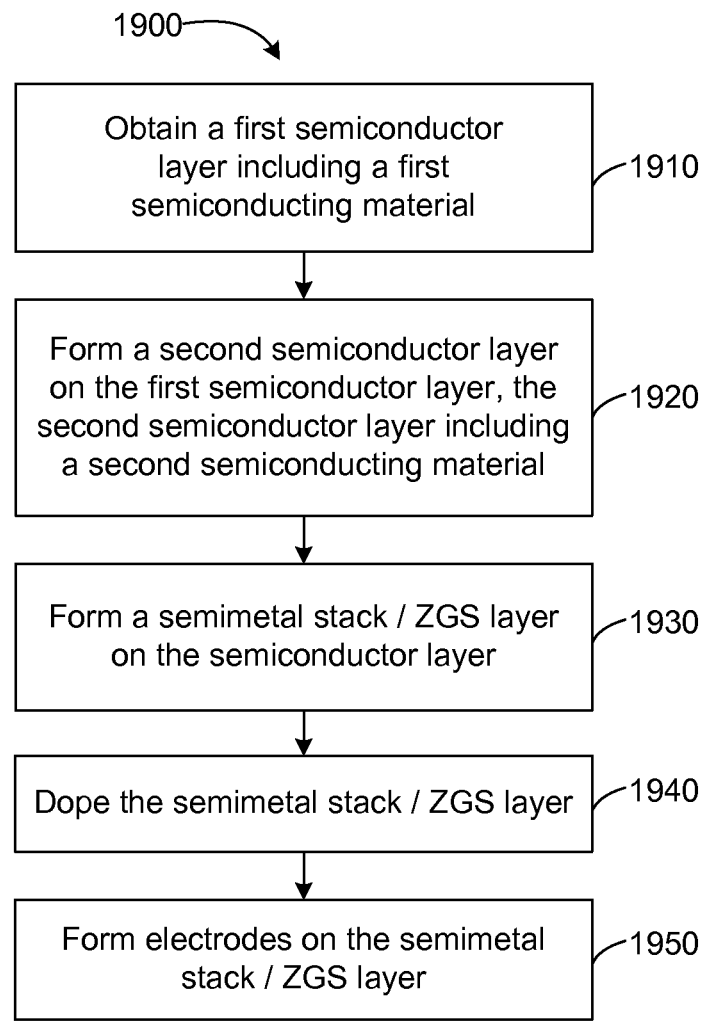

As yet another example, FIG. 19 is a flow chart illustrating an embodiment of a method 1900 of fabricating a HEMT 1500 (FIGS. 15-16). In block 1910, a first semiconductor layer 104 is obtained. The first semiconductor layer 104 includes a semiconducting material, such as, e.g., GaAs. In block 1920, a second semiconductor layer 103 is formed on the first semiconductor layer 104. The second semiconductor layer 103 includes a semiconducting material having a different band gap from the semiconducting material included in the first semiconductor layer 104. For example, in some embodiments, the second semiconducting material is AlGaAs. In other embodiments, combinations of first and second semiconducting materials can include, but are not limited to, GaN and AlGaAs or strontium titanate (STO)/ lanthanum aluminate (LAO).

In block 1930, a semimetal stack 102 or a ZGS layer 102d is formed on the second semiconductor layer 103. The semimetal stack 102 includes graphite and/or graphene. In some embodiments, one or more sheet(s) of graphene may be deposited on the semiconductor layer 103. For example, a single sheet of graphene may be deposited on the semiconductor layer 103 to form the ZGS layer 102d. Block 1930 is the same as blocks 1730 and 1820 in FIGS. 17 and 18, respectively.

Additionally, in some embodiments, the semimetal stack 102 is doped by intercalating dopant atoms within the semimetal stack 102 or coating the ZGS layer 102d as shown in block 1940. Block 1940 is the same as blocks 1740 and 1830 in FIGS. 17 and 18, respectively. In block 1950, two electrodes 1308 (FIGS. 15-16) and a counter electrode 1310 (FIGS. 15-16) are formed on the semimetal stack 102 or the ZGS layer 102d. The counter electrode 1310 is positioned on the semimetal stack 102 between the two electrodes 1308.

Figure 20:
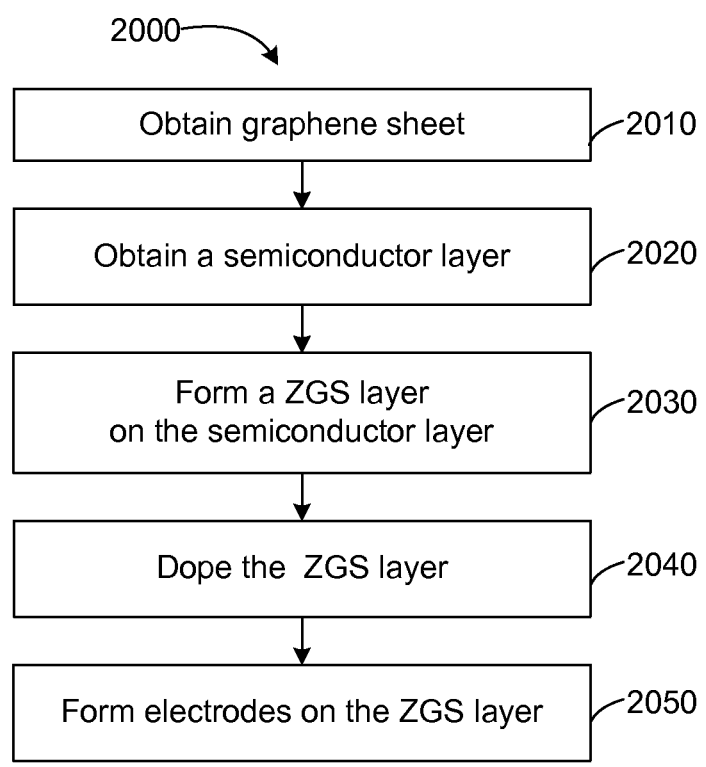

Referring next to FIG. 20, shown is another example of a flow chart illustrating an embodiment of a method 2000 of fabricating a ZGS Schottky diode 100b (FIG. 8), a ZGSFET 1300b (FIGS. 14A-14B), or a ZGS HEMT 1500b (FIG. 16) including a zero gap semiconductor (ZGS) layer 102d of graphene. To begin, a single layer graphene sheet is obtained in block 2010. The single layer graphene sheet may be synthesized, e.g., on a Cu foil via a multi-step, low-vacuum CVD process. The synthesized graphene sheet may be a large-area sheet.

In one implementation, Cu foils (e.g., 25-50 μm-thick Puratronic, 99.9999% Cu) are loaded into a quartz tube furnace operating in CVD-mode. The quartz tube furnace is evacuated to about 4 mTorr, and subsequently heated to about 500° C. under about a 25 sccm flow of $H_2$ at about 325 mTorr. After about a 30 minute soak, the temperature is raised to about 1025° C. for about 60 minutes to promote Cu grain growth (e.g., mean grain size exceeds 5 mm² determined by optical microscopy). An initial low-density nucleation and slow growth phase can be performed at about 1015° C. for about 100 minutes with a mixture of $CH_4$ and $H_2$ at a total pressure of about 90 mTorr and flows of about 0.5 sccm and about 2 sccm, respectively. Full coverage may be achieved by dropping the temperature to about 1000° C. for about 10 minutes while increasing the total pressure and methane flow to about 900 mTorr and about 30 sccm, respectively.

A 1.5 μm-thick film of poly(methyl methacrylate) (PMMA, e.g., MicroChem, 11% in Anisole) is spin-cast onto the Cu foils at about 2000 rpm for about 60 seconds. The exposed Cu may then be etched in an $O_2$ plasma to remove unwanted graphene from the backside of the samples. The PMMA supported films can then etched overnight in about a 0.05 mg/L solution of iron (III) nitrate (e.g., Alfa Aesar) to remove the copper. The graphene-PMMA films were then washed in deionized water, isopropyl alcohol (IPA), and a buffered oxide etch for about 10 minutes each. After growth and transfer, the graphene films may be characterized and identified using a Horiba-Yvon Raman spectrometer with green, red and UV lasers.

In block 2020, a semiconductor layer 104 is obtained. The semiconductor layer 104 includes at least one semiconducting material. In some embodiments, the semiconductor layer 104 is a first layer and a second semiconductor layer 103 is formed on the first semiconductor layer 104, where the second semiconductor layer 103 includes a semiconducting material having a different band gap from the semiconducting material included in the first semiconductor layer 104. Commercially available semiconducting wafers may be used. For example, n-Si(P doping) and n-GaAs(Si doping) substrates may be doped with P ($2-6 \times 10^{15}$ cm$^{-3}$) and Si ($3-6 \times 10^{16}$ cm$^{-3}$), respectively. In some implementations, an epilayer of n-GaN and n-4H—SiC (about 3-6 μm thick) may be grown on semi-insulating sapphire substrates with Si ($1-3 \times 10^{16}$ cm$^{-3}$) and N ($1-3 \times 10^{17}$ cm$^{-3}$) dopants. The substrates may be cleaned using typical surface cleaning techniques. In some embodiments, an ohmic contact layer 106 may also be formed on the semiconductor layer 104.

A zero gap semiconductor (ZGS) layer 102d is formed on the semiconductor layer 104 (or second semiconductor layer 103) in block 2030. In the case of ZGS HEMTs 1500b (FIG. 16), the ZGS layer 102d is formed on the second semiconductor layer 103. For example, a graphene sheet (e.g., the graphene/PMMA sheet) is transferred onto the semiconducting surface of a semiconductor layer 104. In some embodiments, negligible amounts of IPA may be applied to the semiconductor layer 104 prior to forming the ZGS layer 102d. Application of IPA improves the success rate of the graphene transfer. After depositing the graphene/PMMA films, the semiconductor layer 104 with the graphene sheet may be placed in an acetone vapor rich acetone bath container for periods ranging from about 10 minutes to about 10 hours. The acetone bath allows slow removal of the PMMA films without noticeable deformation of the graphene sheets.

In some implementations, ohmic contacts to the semiconductors may be formed using conventional ohmic contact recipes prior to transfer of the graphene sheet. For example, multilayer ohmic contacts may be thermally grown at the back/front side of a semiconductor layer 104 and annealed at high temperatures using rapid thermal annealing (RTA). After the ohmic contact formation, a 0.5-1 μm thick SiOx window can be grown using pressure enhanced chemical vapor deposition (PECVD), and about 500 nm thick gold electrodes can be thermally evaporated onto the SiOx window at $5 \cdot 10^{-7}$ torr.

Additionally, in some embodiments, the ZGS layer 102d may be doped by dopant atoms on the ZGS layer 102d as indicated in block 2040. A ZGS layer 102d may be doped by using spin coating techniques to deposit atomically thin dopants such as, e.g., Gold(III)Chloride, Bis(trifluoromethanesulfonyl)amine, and other organic solutions onto the graphene sheet. The ZGS layer 102d may also be doped with absorbed gases or other absorbants. Electrodes are formed on the ZGS layer 102d in block 2050. Contacts to the ZGS layer 102d may be made with evaporated gold pads in contact with the graphene sheets and ohmic contacts using, e.g., gold wires and silver paint. In some embodiments, two electrodes 1308 (FIG. 16) and a counter electrode 1310 (FIG. 16) are formed on the ZGS layer 102d. The counter electrode 1310 is positioned on the ZGS layer 102d between the two electrodes 1308.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about 'y'".

It should be emphasized that the above-described embodiments are merely possible examples of implementations set forth for a clear understanding of the principles of the disclosure. Many variations and modifications may be made to the above-described embodiments without departing substantially from the spirit and principles of the disclosure. All such modifications and variations are intended to be included herein within the scope of this disclosure and the present application.

Therefore, at least the following is claimed:

1. A semimetal semiconductor field effect transistor (SMESFET) comprising:
   a semiconductor layer including a semiconducting material;
   a semimetal stack including a graphene layer, wherein the semimetal stack is formed on the semiconductor layer, and the semiconductor layer and the semimetal stack form a Schottky barrier; and two electrodes and a counter electrode disposed on a side of the semimetal stack opposite the semiconductor layer and not in contact with the semiconductor layer.

2. The SMESFET of claim 1, wherein the semimetal stack is doped.

3. The SMESFET of claim 2, wherein the semimetal stack includes intercalated impurity atoms.

4. The SMESFET of claim 2, wherein the semimetal stack includes intercalated bromine atoms.

5. The SMESFET of claim 1, wherein the semimetal stack only includes a single graphene layer.

6. The SMESFET of claim 1, wherein the semimetal stack further includes a graphite layer.

7. The SMESFET of claim 6, wherein the semimetal stack further includes a "few layer" graphene layer.

8. The SMESFET of claim 7, wherein the semimetal stack includes a plurality of "few layer" graphene layers.

9. The SMESFET of claim 1, wherein the semiconductor layer includes at least one of the following semiconducting materials: Si, SiC, GaAs, and GaN.

10. The SMESFET of claim 1, wherein the counter electrode is disposed on the semimetal stack between the two electrodes.

11. The SMESFET of claim 1, wherein the two electrodes and the counter electrode are disposed on a graphite layer of the semimetal stack.

12. The SMESFET of claim 1, further comprising an ohmic contact layer disposed on the semiconductor layer, the ohmic contact layer in contact with the semiconductor layer and not in contact with the semimetal stack.

13. A zero gap semiconductor semiconductor field effect transistor (ZGSFET) comprising:
   a semiconductor layer including a semiconducting material;
   a zero gap semiconductor layer including a sheet of graphene, wherein the zero gap semiconductor layer is formed on the semiconductor layer, and the semiconductor layer and the zero gap semiconductor layer form a Schottky barrier; and
   two electrodes and a counter electrode disposed on a side of the zero gap semiconductor layer opposite the semiconductor layer and not in contact with the semiconductor layer.

14. The ZGSFET of claim 13, wherein the zero gap semiconductor layer is doped.

15. The ZGSFET of claim 13, wherein the zero gap semiconductor layer is doped with an atomically thin dopant.

16. The ZGSFET of claim 13, wherein the semiconductor layer includes at least one of the following semiconducting materials: Si, SiC, GaAs, and GaN.

17. The ZGSFET of claim 13, wherein the counter electrode is disposed on the sheet of graphene between the two electrodes.

18. The ZGSFET of claim 13, further comprising an ohmic contact layer disposed on the semiconductor layer, the ohmic contact layer in contact with the semiconductor layer and not in contact with the zero gap semiconductor layer.

19. The ZGSFET of claim 18, wherein the ohmic contact layer is disposed on a side of the semiconductor layer opposite the zero gap semiconductor layer.

20. A zero gap semiconductor field effect transistor (ZGSFET), comprising:
   a semiconductor layer including a semiconducting material; and
   a zero gap semiconductor layer including a sheet of graphene, wherein the zero gap semiconductor layer is formed on the semiconductor layer, and the semiconductor layer and the zero gap semiconductor layer form a Schottky barrier, wherein the zero gap semiconductor layer is doped with an atomically thin dopant that includes Bis(trifluoromethanesulfonyl)amine.

* * * * *